(12) United States Patent
Nabhan et al.

(10) Patent No.: US 12,118,869 B2
(45) Date of Patent: Oct. 15, 2024

(54) GAS SENSING DEVICE DESIGNED FOR ENVIRONMENTAL DECONTAMINATION WITH SIMULTANEOUS ALERT EMISSION

(71) Applicants: José Marcos Nabhan, Cianorte (BR); Vinicius Batistela Nicoletti, Cianorte (BR)

(72) Inventors: José Marcos Nabhan, Cianorte (BR); Vinicius Batistela Nicoletti, Cianorte (BR)

( * ) Notice: Subject to any disclaimer, the term of this patent is extended or adjusted under 35 U.S.C. 154(b) by 67 days.

(21) Appl. No.: 18/304,322

(22) Filed: Apr. 20, 2023

(65) Prior Publication Data

US 2023/0252876 A1 Aug. 10, 2023

Related U.S. Application Data

(63) Continuation-in-part of application No. 17/609,768, filed as application No. PCT/BR2020/050015 on Jan. 24, 2020.

(30) Foreign Application Priority Data

Jan. 22, 2020 (BR) ...................... BR2020200013365

(51) Int. Cl.
*B60W 10/30* (2006.01)
*B60H 1/00* (2006.01)
(Continued)

(52) U.S. Cl.
CPC ............. *G08B 21/14* (2013.01); *B60H 1/008* (2013.01); *G01R 31/382* (2019.01); *G08B 5/38* (2013.01);
(Continued)

(58) Field of Classification Search
CPC ....... G08B 21/14; B60H 1/008; G01R 31/382
See application file for complete search history.

(56) References Cited

U.S. PATENT DOCUMENTS 4,742,761 A 5/1988 Horstman
4,960,041 A 10/1990 Kiser
(Continued)

FOREIGN PATENT DOCUMENTS

BR PI 0601721-5 A 10/2006
CH 712528 * 6/2016 ............. G08B 21/22
(Continued)

*Primary Examiner* — Hongmin Fan
(74) *Attorney, Agent, or Firm* — LaMorte & Associates PC

(57) ABSTRACT

Breathing naturally produces $CO_2$, which means that the presence of people or animals inside the passenger compartment of a vehicle can be detected. In the presence of at least one occupant, in as little as five minutes, the concentration of carbon dioxide can become dangerous. To remediate high concentrations of carbon dioxide within the passenger compartment, a warning is provided that instructs any occupant to start the vehicle. Should the vehicle not be started within a predetermined period of time after the warning, certain automatic remediation actions are taken, provided that the battery of the vehicle retains enough power to start the vehicle. If the automatic remediation actions fail to lower the levels of carbon dioxide, then all available power is utilized to reduce the levels of carbon dioxide and to bring assistance to the occupants of the vehicle.

11 Claims, 2 Drawing Sheets

(51) Int. Cl.
  *G01R 31/382* (2019.01)
  *G08B 5/38* (2006.01)
  *G08B 21/02* (2006.01)
  *G08B 21/04* (2006.01)
  *G08B 21/14* (2006.01)

(52) U.S. Cl.
  CPC ....... *G08B 21/028* (2013.01); *G08B 21/0415* (2013.01)

(56) References Cited

U.S. PATENT DOCUMENTS

| | | | |
|---|---|---|---|
| 5,054,686 A | * | 10/1991 | Chuang .................. E05F 15/41 236/1 R |
| 5,462,485 A | | 10/1995 | Kinkead |
| 5,670,714 A | | 9/1997 | Sorensen |
| 2003/0087600 A1 | | 5/2003 | Meneely |
| 2004/0142678 A1 | | 7/2004 | Krasner |
| 2013/0008224 A1 | | 1/2013 | Stormbom |
| 2016/0091472 A1 | | 3/2016 | Paragon |
| 2016/0103111 A1 | | 4/2016 | Griffin |

FOREIGN PATENT DOCUMENTS

| | | | | |
|---|---|---|---|---|
| CN | 2013/96890 | | 2/2010 | |
| CN | 2015/48485 U | | 8/2010 | |
| CN | 103029549 A | | 4/2013 | |
| CN | 104354695 A | * | 10/2014 | ............ B60W 10/30 |
| CN | 204279000 | * | 11/2014 | |
| CN | 105059226 | * | 8/2015 | ............ B60R 21/015 |
| CN | 105089419 | * | 9/2015 | ............ G08B 21/14 |
| CN | 106515374 | * | 11/2016 | ............ B60H 1/008 |
| CN | 111379501 A | * | 12/2018 | ............. E05F 15/79 |
| CN | 111762111 | * | 4/2019 | ............ B60H 1/008 |
| CN | 2013/96890 Y | | 2/2024 | |
| JP | 2009156801 | * | 12/2007 | ......... B60H 1/00978 |
| JP | 2020154976 A | | 9/2020 | |
| KR | 19980016993 | * | 9/1996 | ............ B60H 1/008 |
| KR | 100204276 | * | 12/1996 | ............ E05F 15/695 |
| KR | 100868920 | * | 9/2007 | ............ B60H 1/008 |
| NL | 1024514 C2 | | 4/2005 | |
| WO | WO 2000/043765 | | 7/2000 | |
| WO | WO 2005/108872 A2 | | 11/2005 | |
| WO | WO 2005/121751 A1 | | 12/2005 | |
| WO | WO 2009/112001 A1 | | 9/2009 | |
| WO | WO 2010/109363 A3 | | 9/2010 | |
| WO | WO 2013/008170 A3 | | 4/2024 | |
| WO | WO 2012/059425 A1 | | 5/2024 | |

\* cited by examiner

GAS SENSING DEVICE DESIGNED FOR ENVIRONMENTAL DECONTAMINATION WITH SIMULTANEOUS ALERT EMISSION

RELATED APPLICATIONS

This application is a continuation-in-part of U.S. patent application Ser. No. 17/609,768 filed Nov. 8, 2021.

FIELD OF THE INVENTION

This invention relates to carbon dioxide detection systems for use in vehicles. More particularly, the present invention relates to carbon dioxide detection systems that sound an alarm and automatically take remedial actions to prevent an occurrence of carbon dioxide poisoning.

PRIOR ART DESCRIPTION

Carbon dioxide ($CO_2$) is present in the atmosphere and is required for plants to perform photosynthesis. However, high concentrations of carbon dioxide can be harmful to human health.

In the breathing process, the body absorbs oxygen and releases $CO_2$. In closed environments, such as motor vehicles, there is a risk of repeatedly rebreathing the same air. This can cause increased levels of $CO_2$ in the blood. This can cause symptoms such as headache, drowsiness, eye irritation, change in humor, and difficulty breathing. Closed environments where people are required to rebreathe air often occurs in vehicles. This is especially true if the vehicle has closed windows and vents to retain the effects of heating or air conditioning.

U.S. Patent Application Publication No. 1999/027788 discloses a sensor for detecting gases, comprising a housing and an active element inside the housing. The active element is surrounded by a porous insulating material with a bulk density not exceeding 0.15 g/cm$^3$. Another gas sensor comprises an active element surrounded by a porous insulating material with a surface area of not more than approximately 200 m$^2$/cm$^3$. Another gas sensor comprises a copper compound positioned so that the gas contacts the copper compound before contacting the active element. Another gas sensor comprises an active element surrounded by a porous material with an average pore size.

Document DK2005000381 discloses IV sensor, especially a $CO_2$ sensor, with a filter arrangement behind which is a detector and an assessment device which is connected to the detector arrangement. The filter arrangement has a first filter and a second filter, of which the first filter passes a predetermined IV band and the second filter does not. The detector arrangement has two detectors, of which each is combined with a filter. It is intended to simplify the application of such an IV sensor. For this purpose, it is foreseen that the passband of one filter is arranged within the passband of the other filter and the assessment device takes the difference between the signals of the detectors and adapts it to the signal of a detector.

Document BR PI0601721-5 A2 teaches a process for determining ozone in the atmosphere, through spectrophotometric and spectrofluorometric measurements, using filters impregnated with indigo blue to collect the gas. Spectrophotometric analyses performed at 600 nm, the process most commonly described in the literature, showed to be significantly sensitive to the action of interferents, compared to measurements made at 250 nm. The data shows that more reliable ozone determinations are obtained in the ultraviolet region. Using a process whose determination is spectrofluorometric, the measurements were quite sensitive, since it is possible to distinguish between close concentrations, which are often not differentiated by the spectrophotometric process. In addition, the selectivity was also superior to the spectrophotometric technique, since there was no interference from any other gaseous species, even when present in a concentration much higher than that of ozone.

Document DE2008000422 teaches a generic method for detecting and identifying gases in interior spaces of an aircraft. The device is small and manageable and has a simple design that enables immediate and simultaneous detection and identification of the gases to be examined. This is achieved in the fact that the air supply from the interior space of the aircraft is directed to a measuring device and the measurement results of the measuring device are analyzed by means of mathematical methods. Such methods and associated devices to detect and identify gases in the interior spaces of aircraft are used to detect and verify gases, particularly odors and explosive gases and/or gases harmful to human health.

Document IB2010051043 discloses a sensor chip for gas, equipped with cells to emit and receive ultrasound and is set to a sufficiently large frequency range and to measure the concentration of at least one of the gas components based on at least two responses within the range. The frequency range can be achieved by varying the size of the cell membranes, varying the bias voltages, and/or by varying the air pressure. The sensor chip can be applied, for example, in capnography. A measurement air chamber is implemented in the airway and it and/or the airway can be designed to reduce turbulence in exhaled breath subject to ultrasound interrogation. The chip can be implemented as independent in monitoring parameters, avoiding the need for off-chip sensors.

Document EP2011068984 reveals an air treatment device comprising an air purification unit, configured to purify the air. An air sensor is configured to measure a first amount of air and provide a measurement output, wherein the first amount of air comprises air purified by the air purification unit. A processor is configured to generate a first value based on the measurement output of the air sensor so as to calibrate the air sensor. Another embodiment of the invention also provides a method for calibrating an air sensor of an air treatment device. The method comprises the steps of purifying the air using the air treatment device and measuring a first amount of air using the air sensor to obtain a first value so as to calibrate the air sensor.

Document IB2012053501 deals with the method to selectively detect the concentration of a target gas in polluted ambient air. A target gas sensor is exposed to a first gas flow for a first time interval and obtains a first output signal from the sensor. The target gas sensor is exposed to a second gas flow for a second time interval not overlapping the first time interval and obtaining a second output signal. The system calculates the difference between the first and second output signals and calculate the target gas concentration from the calculated signal difference.

U.S. Patent Application Publication No. 2016/0103111 teaches a vehicle occupant safety system that includes a carbon dioxide sensor and a controller. The $CO_2$ sensor is configured to determine a concentration of $CO_2$ in a vehicle's passenger cabin while the vehicle is not in operation, i.e., parked. The controller is configured to determine which passenger cabin is occupied by an occupant based on the concentration of $CO_2$ in the passenger cabin while the vehicle is not in operation. If $CO_2$ concentration is a concern while the vehicle is not in operation, the system can respond by activating a means of notification, such as a horn or vehicle alarm, or by ventilating the passenger cabin, using the vehicle's HVAC system. However, such remediation efforts consume power from the battery of the vehicle and cannot be sustained reliably beyond ten minutes. Such remediation efforts are meaningless if the occupants of the vehicle remain in the vehicle long after the vehicle battery runs out of power. This prior art system can also open windows. However, if pets have been left in the vehicle, opening the windows can enable the pets to escape. It can also leave the occupants of the vehicle vulnerable to hypothermia if the temperature outside the vehicle is cold.

A need therefore exists for a carbon dioxide monitoring system that can be used in a vehicle, where high concentrations of $CO_2$ can be mitigated in a manner that conserves power in order to produce a long term mitigation solution. This need is met by the present invention as described and claimed below.

SUMMARY OF THE INVENTION

Breathing naturally produces $CO_2$, which means that the presence of people or animals inside the passenger compartment of a vehicle can be detected. In the presence of at least one occupant, in as little as five minutes, the concentration of carbon dioxide can exceed 1000 ppm, which is the tolerance limit recommended by the World Health Organization.

To remediate high concentrations of carbon dioxide within the passenger compartment of a vehicle, a warning is provided within said passenger compartment that instructs any occupant of said vehicle to start the vehicle. Should the vehicle not be started within a predetermined period of time after the warning then certain automatic remediation actions are taken, provided that the battery of the vehicle retains enough power to start the vehicle.

If the automatic remediation actions fail to lower the levels of carbon dioxide, then concerns of preserving enough battery power to start the vehicle are abandoned. All available power is utilized to reduce the levels of carbon dioxide and to bring assistance to the occupants of the vehicle.

BRIEF DESCRIPTION OF THE DRAWINGS

For a better understanding of the present invention, reference is made to the following description of exemplary embodiments thereof, considered in conjunction with the accompanying drawings, in which.

DETAILED DESCRIPTION OF THE DRAWINGS

Although the present invention system can be embodied in many ways, only one exemplary embodiment is illustrated. The exemplary embodiment is being shown for the purposes of explanation and description. The exemplary embodiment is selected in order to set forth one of the best modes contemplated for the invention. The illustrated embodiment, however, is merely exemplary and should not be considered as a limitation when interpreting the scope of the appended claims.

Figure 1:
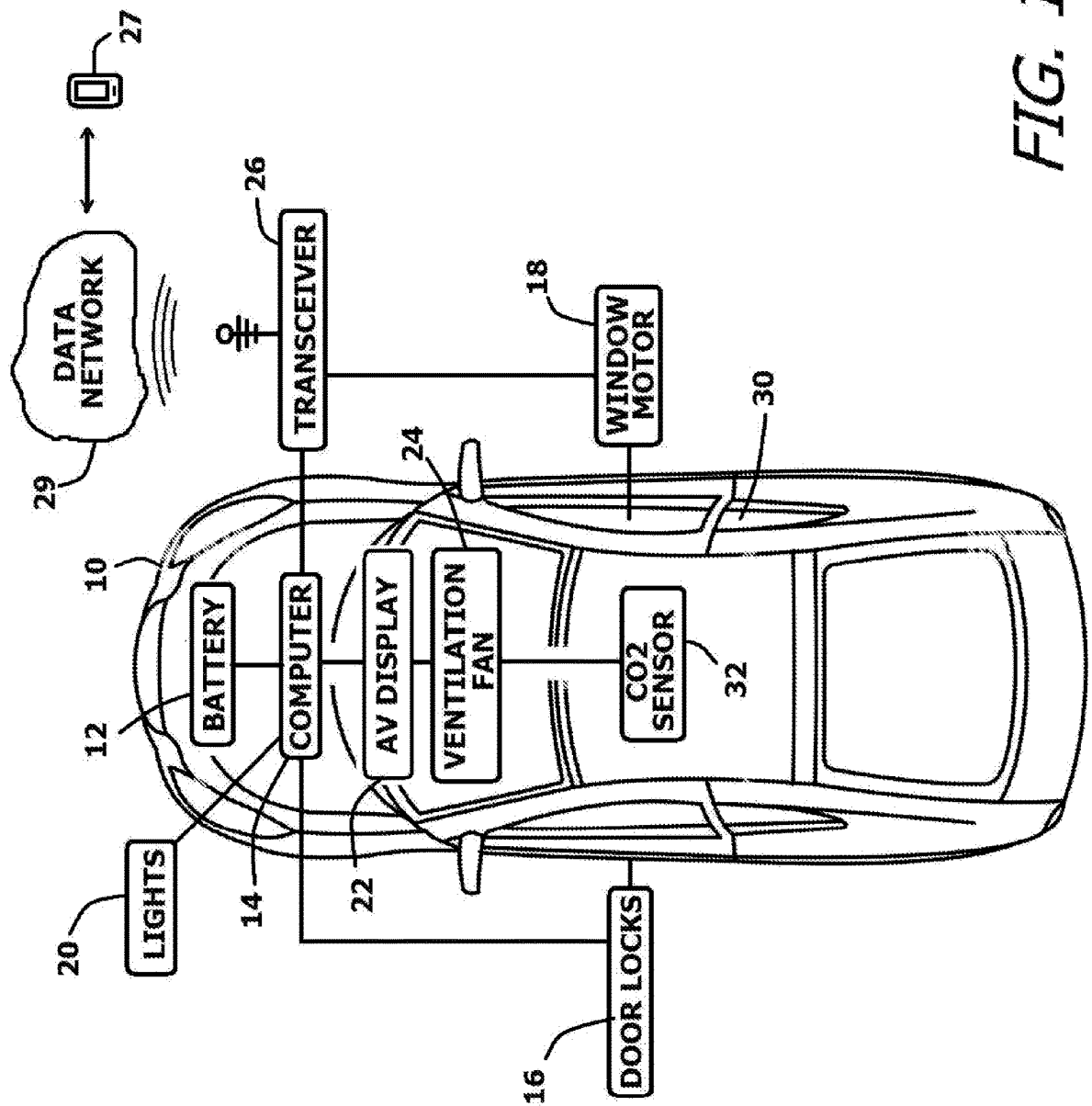
FIG. 1 is a schematic of an exemplary vehicle containing the present invention carbon dioxide detection system.

Referring to FIG. 1, a vehicle 10 is shown that has been upgraded with the present invention $CO_2$ detection system. Although the illustrated vehicle 10 is a passenger car, it should be understood that the vehicle 10 can be an airplane, truck cabin, boat, motorhome, or the like. The vehicle 10 being illustrated is intended to be exemplary of any vehicle that has an enclosed passenger compartment.

The vehicle 10 has a battery 12 that is typically charged by the engine of the vehicle 10. If the vehicle 10 is an electric vehicle, then the battery 12 is charged when the vehicle 10 is connected to a charging station. The vehicle 10 has various components and systems that are electrically operated. Accordingly, when the vehicle 10 is not running, these components and systems draw power directly from the battery 12. The various components and systems include at least one computer 14, electric door locks 16, electric window motors 18, lights 20, an audio/visual display 22, and a ventilation fan 24. The computer 14 contains circuitry and/or programming that monitors the power level of the battery 12. The vehicle 10 may also have a transceiver 26 that enables the vehicle 10 to communicate with a data network 29, such as a cellular network. The same data network 29 can also be accessed by a computer or smart device 27 that runs the appropriate software application 28.

The vehicle 10 has a passenger compartment 30. People and/or pets can be waiting in the passenger compartment 30. The people may smoke, therein increasing the rate that $CO_2$ is released into the passenger compartment 30. The purpose of the present invention system is to monitor $CO_2$ levels within the passenger compartment 30 of the vehicle 10 and to take active measures to ensure that the $CO_2$ levels do not rise to dangerous concentrations. For this purpose, a $CO_2$ sensor 32 is provided within the passenger compartment 30 of the vehicle 10. The levels of $CO_2$ that collect in the passenger compartment 30 rarely become dangerous while the vehicle 10 is in motion. This is because most modern vehicles automatically ventilate the passenger compartment as they run. Furthermore, fresh air is brought in using the windows and/or the heating, ventilation and/or air conditioning systems. Danger typically arises when a vehicle 10 is shut off and one or more people and/or pets are waiting in the passenger compartment 30. In such a scenario, $CO_2$ levels within the vehicle 10 can quickly rise to dangerous levels.

When a vehicle with an engine is shut down, the battery is designed to hold enough power to restart the vehicle. Often, the electrical systems of the vehicle can be operated for short periods of time. However, prolonged use of electrical systems after shut down can quickly drain the battery. This is well known to many people who have unintentionally left headlights on to find after only a few minutes that the battery lacks the power to restart the vehicle.

Figure 2:
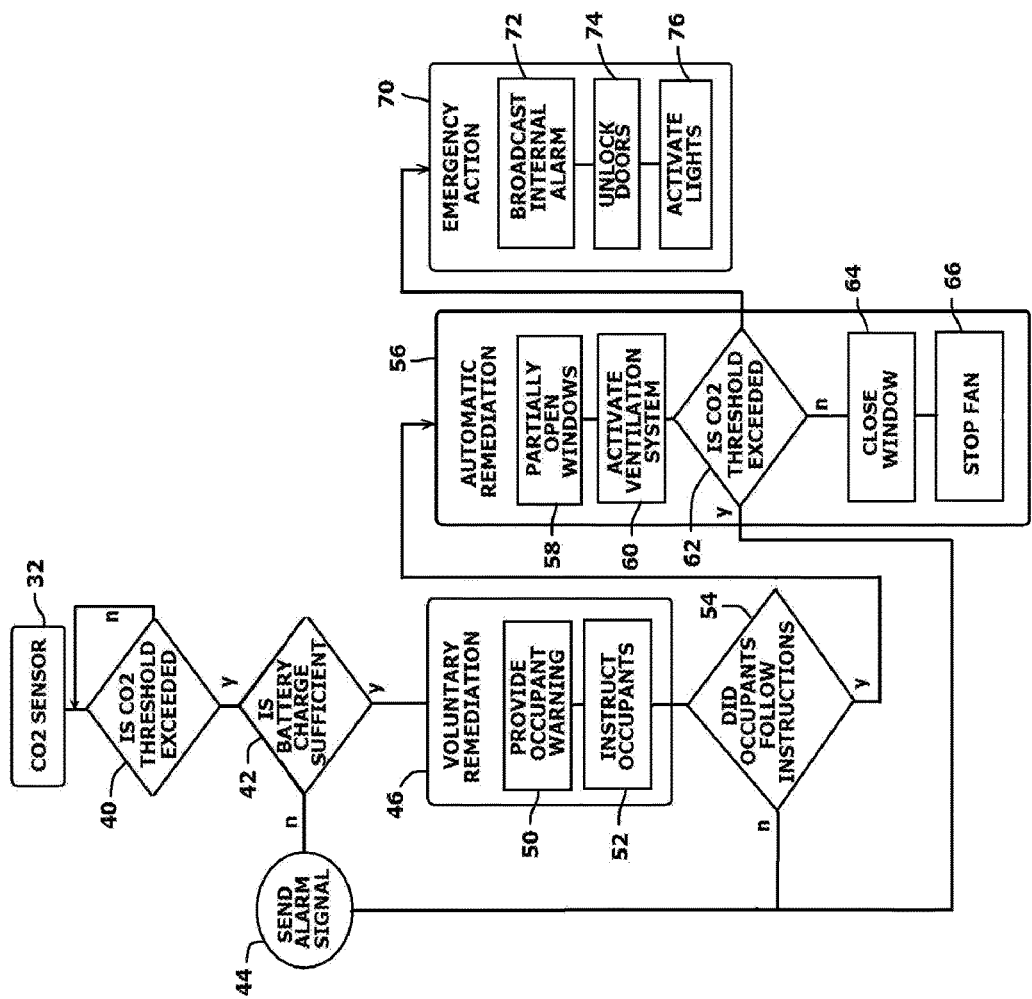
FIG. 2 is a block flow diagram outlining the operations of the exemplary carbon dioxide detection system shown in FIG. 1.

Referring to FIG. 2 in conjunction with FIG. 1, the operational methodology of the present invention system is shown. The operational method contains power management protocols to ensure that when people and/or pets are waiting in a vehicle 10 and the $CO_2$ levels begin to rise, the battery power that is available is adequate to save those people from potential harm over a prolonged period of time.

Within the passenger compartment 30, the $CO_2$ sensor 32 detects levels of $CO_2$. A danger threshold is set. For example, the danger threshold can be set at 700 ppm of $CO_2$ or 1000 ppm of $CO_2$. If the level of $CO_2$ detected by the $CO_2$ sensor 32 exceeds the threshold, then the amperage charge of the battery is accessed. See Block 40 and Block 42. If the power available in the battery 12 is near or below the power needed to start the vehicle 10, then an alarm signal is immediately sent while some power is still available. See Block 44. The alarm signal is sent through the transceiver 26 and the data network 29 to the computer and/or smart device 27 that is running the appropriate software application 28. The alarm signal is most likely to be sent to the owner of the vehicle 10. The owner of the vehicle 10 is most likely to be sitting in the vehicle and is also most likely to know the identity of any other person who is sitting in the vehicle 10. The alarm signal can indicate the potentially harmful condition and can suggest that the vehicle 10 be started, the windows opened, and/or another remediation tried.

As is indicated by Block 46, if the battery 12 is fully charged or is charged enough to start the vehicle 10, then a first period of voluntary remediation is launched. Using the audiovisual display 22 within the vehicle 10, the occupants of the vehicle 10 are informed of the potentially dangerous levels of $CO_2$. See Block 48. The occupants are also instructed to start the vehicle 10. See Block 50. Starting the vehicle 10 is the best long-term solution for providing the power needed for remediation. Furthermore, many vehicles have automatic ventilation systems that activate when the vehicle 10 is started. If the vehicle 10 is started, then there is renewable supply of electrical power upon which to draw. The occupants of the vehicle 10 can be instructed to activate the ventilation fan and/or open the windows. See Block 52. These actions will quickly lower the concentration of $CO_2$ in the passenger compartment. Once the $CO_2$ levels fall back to normal, the system can inform the occupants of the vehicle 10 to turn the vehicle off, close the windows and/or stop the ventilation fan.

The initial period of voluntary remediation can be between five minutes and ten minutes. If the instructions provided to the occupants of the vehicle are not heeded, then the vehicle 10 will not be started. If the allowed period of time elapses and the $CO_2$ levels being sensed are still over the threshold, then a subsequent period of automatic remediation is started. See Block 54 and Block 56.

During the period of automatic remediation, the windows of the vehicle 10 are automatically partially opened. See Block 58. If battery power is sufficient, the ventilation fan is automatically activated. See Block 60. The windows are only partially opened to prevent any pet, such as a dog or cat, in the vehicle 10 from escaping. An alarm indicator is also sent to the computer or smart device 27 running the software application 28. See Block 44.

The partial opening of the windows and/or the running of the ventilation fan 24 should diminish the dangerous levels of $CO_2$. The period of automatic remediation preferably lasts between five minutes and ten minutes. If the air quality improves during this period, then the windows are again closed and the ventilation fan 24 stopped. See Block 62, Block 64, and Block 66. In this manner, pets or children waiting in the vehicle 10 during a very cold day will not freeze.

If the concentration of $CO_2$ does not diminish during the period of automatic remediation, then a period of emergency action is taken. See Block 70. If the emergency action period is initiated, concerns for the charge in the battery 12 are abandoned. If an emergency condition is detected, then all available power is directed towards actions that serve to save the occupants of the vehicle 10.

With the remaining power, an emergency alarm signal is sent to the smart device 27 running the software application 28. See Block 44. The same alarm is broadcast into the passenger compartment 30 and the doors are automatically unlocked to enable people outside the vehicle 10 to access the passenger compartment 30. See Block 72 and Block 74.

The windows would already be partially open. If enough power remains in the battery 12, then the ventilation fan 24 will activate. Provided there is enough power available to run the ventilation fan 24 for at least five minutes, external alarms can also be activated. See Block 76 and Block 78. The external alarms include the flashing of the lights 20 on the vehicle 10 and the sounding of the horn 21. The external alarms are periodically activated and deactivated to prolong the overall length of active time can be extended.

It will be understood that the embodiment of the present invention that is illustrated and described is merely exemplary and that a person skilled in the art can make many variations to that embodiment. All such embodiments are intended to be included within the scope of the present invention as defined by the claims.

What is claimed is:

1. A method for remediating high concentrations of carbon dioxide within the passenger compartment of a vehicle, said method comprising:
    monitoring carbon dioxide levels within said passenger compartment using a carbon dioxide sensor;
    providing a warning within said passenger compartment that instructs any occupant of said vehicle to start said vehicle, should said carbon dioxide levels surpass a predetermined threshold;
    automatically opening at least one window of said vehicle should said vehicle not be started within a predetermined period of time after said warning.

2. The method according to claim 1, further including transmitting an alarm message to a remote smart device should said carbon dioxide levels surpass said predetermined threshold.

3. The method according to claim 1, wherein said vehicle has a battery and said method includes monitoring power available from said battery.

4. The method according to claim 3, further including determining if said battery has power in surplus of what is needed to start said vehicle.

5. The method according to claim 4, further including automatically operating a ventilation fan in said vehicle should said vehicle not be started within said predetermined period of time after said warning and should said battery have power in surplus of what is needed to start said vehicle.

6. The method according to claim 5, wherein said vehicle has doors that lead to said passenger compartment, and wherein said doors are automatically unlocked should said ventilation fan run beyond a preselected run time and said carbon dioxide levels remain above said predetermined threshold.

7. The method according to claim 5, wherein said vehicle has lights and wherein said lights automatically flash should said ventilation fan run beyond said preselected run time and said carbon dioxide levels remain above said predetermined threshold.

8. A method for remediating high concentrations of carbon dioxide within the passenger compartment of a vehicle that has a battery, said method comprising:
    monitoring power available from said battery;
    monitoring carbon dioxide levels within said passenger compartment using a carbon dioxide sensor;
    providing a warning within said passenger compartment that instructs any occupant of said vehicle to start said vehicle, should said carbon dioxide levels surpass a predetermined threshold;
    automatically performing some remedial measures to reduce said carbon dioxide levels should said vehicle not be started within a predetermined period of time after said warning and should said battery contain power in surplus of that needed to start said vehicle.

9. The method according to claim 8, wherein said remedial measures are selected from a group consisting of: partially opening at least one window, activating at least one ventilation fan, and sending an alert to a computing device that is remote from said vehicle.

10. The method according to claim 8, further including performing at least one emergency measure to reduce said carbon dioxide levels should said vehicle not be started within said predetermined period of time after said warning and should said battery not contain power in surplus of that needed to start said vehicle.

11. The method according to claim 10, wherein said at least one emergency measure is selected from a group consisting of: partially opening at least one window, activating at least one ventilation fan, sending an alert to a computing device that is remote from said vehicle, flashing lights on said vehicle, sounding a horn of said vehicle, and unlocking doors of said vehicle.

\* \* \* \* \*